(12) United States Patent
Li et al.

(10) Patent No.: US 11,604,151 B2
(45) Date of Patent: Mar. 14, 2023

(54) SURFACE TOPOGRAPHY MEASUREMENT APPARATUS AND METHOD

(71) Applicant: Applied Materials, Inc., Santa Clara, CA (US)

(72) Inventors: Weimin Li, Singapore (SG); Wen Xiao, Singapore (SG); Vibhu Jindal, San Jose, CA (US); Sanjay Bhat, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/747,639

(22) Filed: May 18, 2022

(65) Prior Publication Data
US 2022/0283100 A1 Sep. 8, 2022

Related U.S. Application Data

(62) Division of application No. 17/106,555, filed on Nov. 30, 2020, now Pat. No. 11,422,096.

(51) Int. Cl.
*G01N 21/956* (2006.01)
*G03F 7/20* (2006.01)
*G03F 1/24* (2012.01)

(52) U.S. Cl.
CPC .............. *G01N 21/956* (2013.01); *G03F 1/24* (2013.01); *G03F 7/7085* (2013.01); *G01N 2021/95676* (2013.01)

(58) Field of Classification Search
CPC ........ G01N 21/956; G01N 2021/95676; G03F 1/24; G03F 7/7085
See application file for complete search history.

(56) References Cited

U.S. PATENT DOCUMENTS

| 7,205,237 | B2 | 4/2007 | Deering et al. |
| 10,018,572 | B2* | 7/2018 | Bills .................... G01N 21/474 |
| 10,191,393 | B2 | 1/2019 | Westerlaken et al. |
| 2005/0117163 | A1 | 6/2005 | Ng et al. |
| 2017/0131629 | A1 | 5/2017 | Hamamoto et al. |

(Continued)

FOREIGN PATENT DOCUMENTS

| EP | 0759536 B1 | 10/1999 |
| JP | 07005181 A | 1/1995 |

OTHER PUBLICATIONS

PCT International Search Report and Written Opinion in PCT/US2021/060445 dated Mar. 15, 2022, 8 pages.

(Continued)

*Primary Examiner* — Hung V Nguyen
(74) *Attorney, Agent, or Firm* — Servilla Whitney LLC (57) ABSTRACT

Apparatus and methods for measuring surface topography are described. The analysis apparatus and methods detect light reflected from the reflective backside of a cantilever assembly including a tip, calculate a background level (BGL) value obtained from an optical scan of a reference sample using a power spectral density (PSD) value obtained from a topographical scan of a reference sample to generate a correlational coefficient between the BGL and the PSD values. The correlational coefficient between the BGL and PSD values is used to measure the BGL value of additional EUV mask blanks by a topographical scan of the EUV mask blanks using the same tip mounted to the cantilever.

17 Claims, 8 Drawing Sheets

(56) References Cited

U.S. PATENT DOCUMENTS

| | | |
|---|---|---|
| 2017/0160309 A1 | 6/2017 | Yang et al. |
| 2019/0094699 A1 | 3/2019 | Schuster et al. |
| 2020/0192231 A1 | 6/2020 | Cramer et al. |
| 2020/0211813 A1 | 7/2020 | Mack |
| 2020/0340807 A1 | 10/2020 | Hu et al. |

OTHER PUBLICATIONS

Cusumano, J.P., "The Power Spectral Density and the Autocorrelation", Experimental Nonlinear Dynamics Supplemental Handout.

Grobelny, J., et al., "Quantification of the meniscus effect in adhesion force measurements", Applied Physics Letters 88, 091906 (2006).

Willstrop, R. V., "Exact optics—III. Schwarzschild's spectrograph camera revised", Mon. Not. R. Astron. Soc. 348, 1009-1018 (2004).

* cited by examiner

SURFACE TOPOGRAPHY MEASUREMENT APPARATUS AND METHOD

CROSS-REFERENCE TO RELATED APPLICATIONS

This application is a divisional of U.S. patent application Ser. No. 17/106,555, filed on Nov. 30, 2020.

TECHNICAL FIELD

Embodiments of the present disclosure generally relate to surface topography measurement of surfaces. In particular, embodiments of the disclosure are directed to surface topography measurement apparatus and methods, which are used to evaluate extreme ultraviolet (EUV) mask blank surfaces.

BACKGROUND

Measurement and quantification of defects on EUV mask blanks is an important part of the semiconductor manufacturing process. A problem in the analysis of EUV mask blanks concerns the light source and optics involved, as well as the illuminating wavelength. Roughness induced multilayer scattering, also known as non-specular scattering, is measured by a sensor which detects the defect as a spot signal brighter than its background level (BGL). The BGL is caused by the light scattered from the EUV mask blank surface that propagate which is then collected through a region confined between an inner and outer numerical aperture (NA). Non-specular scattering can raise the overall BGL and reduce the contrast between defect based signals and the BGL when it occurs at the illuminating wavelength.

Roughness measurements using traditional root mean square (RMS) roughness expresses the roughness of a surface in terms of the height deviations from a mean plane. RMS roughness can differentiate two different surfaces which have different RMS roughness values, however, two different surfaces can exhibit the same RMS roughness value when the microstructure of the surfaces vary because the RMS roughness value is a root mean square average of the profile height deviations taken along the length of surfaces evaluated. Power Spectral Density (PSD) represents a way to describe surface roughness as a function of angular repartition of scattered light and is different than traditional RMS to provide a more accurate description and evaluation of surface roughness and, in turn, surface defects. PSD of the surface topography of a sample performs a decomposition of the surface profile into its spatial wavelength and allows comparison of roughness measurement over different spatial frequency ranges.

Optical analysis of EUV mask blanks is expensive and time-consuming. Accordingly, it would be desirable to provide methods and apparatus that avoid dependency on expensive and time-consuming optical analytical equipment.

SUMMARY

A first embodiments is directed to a surface topography measurement apparatus comprising a platform disposed within an enclosure, the platform configured to support a substrate comprising a measurement surface; a cantilever assembly disposed within the enclosure, the cantilever assembly comprising a cantilever having a reflective backside and a tip configured to perform a topographical scan of the measurement surface; a light source positioned to reflect light from the reflective backside of the cantilever assembly; an ionizing source disposed within the enclosure and configured to remove surface charging from the measurement surface during topographical scanning; an environmental control system configured to control temperature and humidity within the enclosure; and a detector configured to detect light reflected from the reflective backside of the cantilever assembly, the detector in communication with a controller including a processor configured to calculate a background level (BGL) value obtained using scattered light obtained from an optical scan of a reference sample and a power spectral density (PSD) value obtained from a topographical scan of the reference sample to generate a correlational coefficient between the BGL value and the PSD value.

Another aspect pertains to a method for detecting a background level (BGL) value on EUV mask blanks, the method comprising performing an optical scan of a measurement surface of a reference sample using a camera with an objective lens to receive scattered light from surface roughness on the measurement surface of the reference sample; performing a topographical scan of the measurement surface of the reference sample with a tip mounted to a cantilever and obtaining a power spectral density (PSD) value of the measurement surface of the reference sample from the topographical scan; utilizing the BGL value of the measurement surface of the reference sample and the PSD value of the measurement surface of the reference sample to calculate a correlational coefficient between the BGL value and the PSD value; and utilizing the correlational coefficient between the BGL value and the PSD value to determine the BGL value of additional EUV mask blanks by a topographical scan of the EUV mask blanks using the tip mounted to the cantilever. In some embodiments of the method, the optical scan of the measurement surface of the reference sample comprises scanning the measurement surface of the reference sample with an EUV light source. In some embodiments of the method, the PSD value is defined by an inner numerical aperture and an outer numerical aperture of the objective lens used in the optical scan.

DETAILED DESCRIPTION

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

According to one or more embodiments, the phrase "reference sample" refers to a surface of a sample, or portion of a surface of sample having a measurement surface that is analyzed through at least one of an optical measurement or scan, a topographical measurement or scan, or a combination thereof. In specific embodiments, the "reference sample" is an EUV mask blank. According to one or more embodiments, the phrase "roughness reference sample," refers to a surface of a sample, or portion of a surface of a sample having a measurement surface that is analyzed by the surface topography measurement apparatus 120. In specific embodiments, a roughness reference sample comprises a material that has an RMS roughness that is greater than the reference sample RMS roughness. In some embodiments, the roughness reference sample comprises a material that has a Knoop hardness that is greater than the reference sample Knoop hardness. In some embodiments, the roughness reference sample comprises a material that has a density that is greater than the reference sample density. In some embodiments, the roughness reference sample comprises a material that has an elastic modulus that is greater than the reference sample elastic modulus.

In a specific, non-limiting example, a reference sample comprising EUV mask blank having a measurement surface comprising a ruthenium capping layer over a multilayer reflector stack of alternating Mo/Si layers had a Knoop hardness of about 460 kg/mm$^2$, a density of 2.2 g/cm$^3$, an elastic modulus of 68 GPa and a surface RMS roughness of 0.2 nm. For such a reference sample suitable reference sample would have at least a RMS roughness exceeding the value of the reference sample, and in some embodiments, one or more of the Knoop hardness, elastic modulus and density would also exceed that of the measurement surface of the reference sample. For example chromium nitride (CrN) has a Knoop hardness of about 2000-2500 kg/mm$^2$, a density of 5.9 g/cm$^3$, an elastic modulus of 217 GPa and a surface RMS roughness of 0.6 nm. Other suitable materials for the roughness reference sample include titanium nitride (TiN), and tantalum nitride (TaN).

In one or more embodiments directed to EUV mask blanks, the roughness reference sample has a modulus in a range of from about 100 GPa to 300 GPa, a hardness in a range of from 2,000 kg/mm$^2$ to 2,500 kg/mm$^2$, and a surface roughness in the range of from 0.4 nm RMS to 1.1 nm RMS, for example, 0.5 nm RMS to 0.8 nm RMS. Examples of roughness reference sample materials are selected from the group consisting of, but not limited to, chromium nitride (CrN), titanium nitride (TiN), and tantalum nitride (TaN). In one or more embodiments, roughness reference samples with higher hardness and elastic modulus than that of an EUV mask blank are used and are wear resistant to provide stability of the roughness reference sample. In a specific embodiment, for the measurement of EUV mask blanks, it was determined the CrN was a suitable roughness reference sample material because it shows much higher hardness, density and modulus than EUV mask blank therefore it is stable as a roughness reference sample. Since the surface roughness of CrN is much higher than EUV mask blanks, CrN is a good roughness reference to evaluate the sharpness of the probe tip. However, the surface RMS cannot be too high because it may wear the tip of the cantilever assembly. It has been determined that a specific range of from 0.1 nm RMS to 0.3 nm RMS is a range in EUV mask blank measurements. In one or more embodiments, TiN and TaN are materials for EUV mask blank roughness reference samples because they have even higher hardness and modulus than CrN but the surface RMS of the roughness reference sample will need to be controlled by the deposition process to make the roughness reference sample.

In one or more embodiments, a BGL value calculated based on a power spectral density (PSD) measurement of the reference sample is used to evaluate the BGL value based on the PSD measurement of the reference sample to provide an accurate PSD value as described further herein. In some embodiments, a surface topography measurement apparatus with a scanning tip that is monitored for sharpness is utilized for accurate EUV mask blank surface optical scattering analysis to provide accurate PSD values.

A "scan" according to one or more embodiments, refers to any raw data measured by an analytical tool, apparatus or method. For example, in specific embodiments, a topographical scan includes a surface measurement using an atomic force microscope (AFM). Another example is an optical scan, which in specific embodiments pertaining to EUV mask blanks, is performed with an actinic inspection device to yield a measured BGL value. Additionally, in one or more embodiments, the term "scanning" a substrate or a measurement surface may be used interchangeably with the term "analyzing" a substrate.

One or more embodiments of the disclosure provide a surface topography measurement apparatus. In some embodiments, the surface topography measurement apparatus comprises an enclosure and utilizes a cantilever and a tip, for example, an AFM. The surface topography apparatus further comprises a platform disposed within the enclosure, and the platform is configured to support a substrate comprising a measurement surface. In embodiments, the substrate can be a reference sample or a roughness reference sample. In one or more embodiments, the roughness reference sample is utilized to monitor tip sharpness of the surface topography measurement apparatus.

In some embodiments, the surface topography measurement apparatus comprises a cantilever assembly disposed within the enclosure, the cantilever assembly comprising a reflective backside and a tip configured to perform a topographical scan of a measurement surface. In one or more embodiments the reflective backside comprises a reflective metal such as aluminum.

The surface topography measurement apparatus includes a light source positioned to reflect light from the reflective backside of the cantilever assembly. In one or more embodiments, the apparatus comprises an ionizing source disposed within the enclosure configured to remove surface charging from the measurement surface during topographical scanning. One or more embodiments of the apparatus comprises an environmental control system further comprises a temperature controller and a humidity controller configured to control temperature and humidity within an enclosure. Some embodiments of the apparatus utilize a gas purge system configured to reduce moisture within the enclosure. One or more embodiments of the apparatus comprise a nitrogen gas supply to reduce surface moisture of the reference sample and/or the roughness reference sample, which in turn reduces adhesion force between the reference sample or roughness reference sample and the tip, thereby reducing noise in topographical scan data.

In one or more embodiments, a detector is configured to detect light reflected from the reflective backside of the cantilever assembly, which obtains surface topography of the reference sample or roughness reference sample. The detector is in communication with a controller including a processor configured to transform the topographical scan data into a PSD value, compare the measured BGL value of reference sample with the PSD value of the same reference sample measured on a surface topography measurement apparatus 120 as shown in FIG. 2, and generate a correlational coefficient between the measured BGL and PSD values.

Figure 1A:
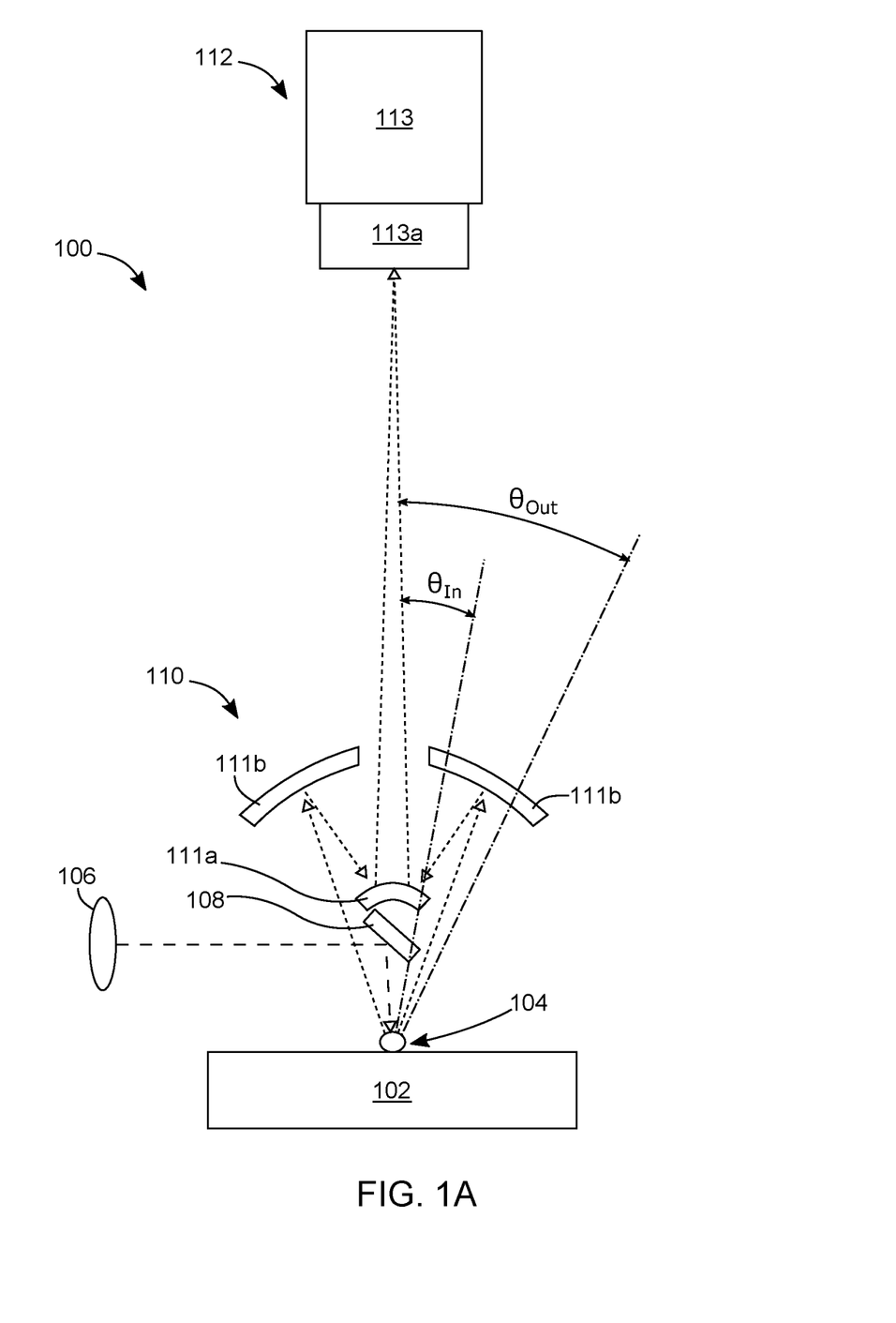
FIG. 1A illustrates an example of an actinic defect detection apparatus.

FIG. 1A shows an example of an optical scanning apparatus 100 utilized according to one or more embodiments of the disclosure to obtain an optical surface topography measurement. The optical scanning apparatus 100 includes an EUV light source 106 that emits EUV light represented by dashed horizontal line in FIG. 1A, which is reflected from a reflector 108 and illuminates a reference sample substrate 102. In one or more embodiments, the EUV light source 106 emits light, represented by the dashed horizontal line in FIG. 1A, which is in a wavelength range from about 10 nm to 50 nm, for example from 10 nm to 40 nm, from 10 nm 30 nm, from 10 nm to 20 nm, from 10 nm to 17 nm, for example, from 12 nm to 14 nm, more specifically 13.5 nm. In one or more embodiments, the EUV light source 106 includes a laser.

Figure 1B:
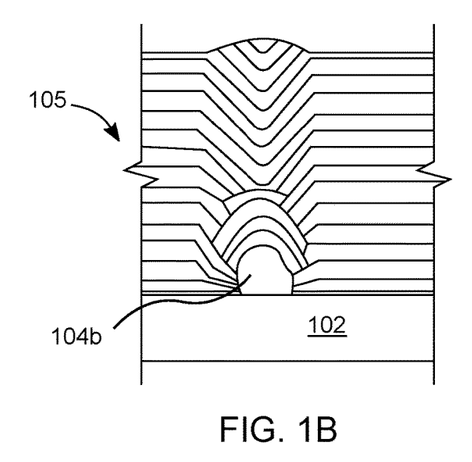
FIGS. 1B and 1C illustrate examples of common surface defects on an EUV mask blank.
Figure 1C:
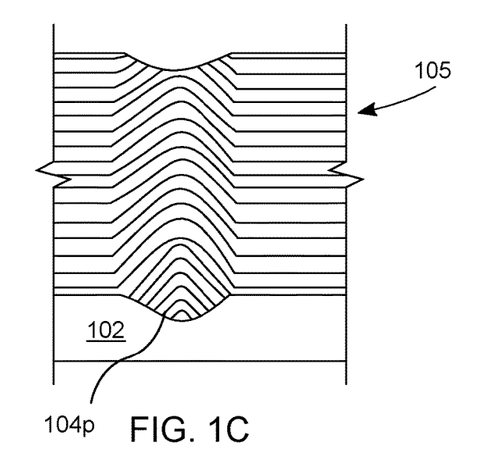
Figure 1D:
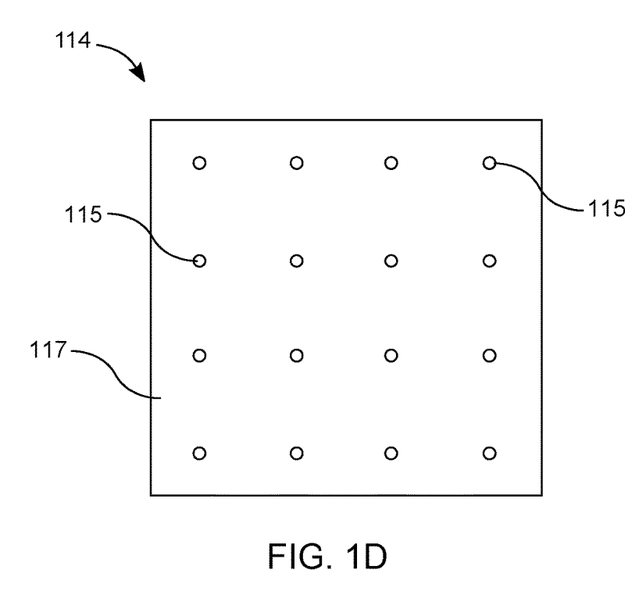
FIG. 1D illustrates a dark field representation of defects on a surface.

A surface defect 104 on the reference sample substrate 102 scatters the EUV light, which passes through Schwarzschild optics including a first mirror 111a and a second mirror 111b. The EUV light is then directed to a detector 112, which in the embodiment shown comprises a camera 113 including an objective lens 113a. In specific embodiments, the camera 113 comprises a charge coupled device (CCD) camera. FIG. 1B illustrates an example of a bump defect 104b and FIG. 1C illustrates an example of a pit defect 104p, either of which scatter light which is detected by detector 112 including a camera 113 including the objective lens 113a. FIG. 1D is a dark field image 114 generated by the optical scanning apparatus 100, which shows the dark field image 114 of the defect 104 including bright spots 115 that appear in a dark field 117 signifying the defects on the reference sample substrate 102. It will be appreciated that the dark field 117 on an actual dark field image will be dark (in some instances black) and the bright spots will appear as points of light, which are not clearly shown in the black and white line drawing.

Figure 2:
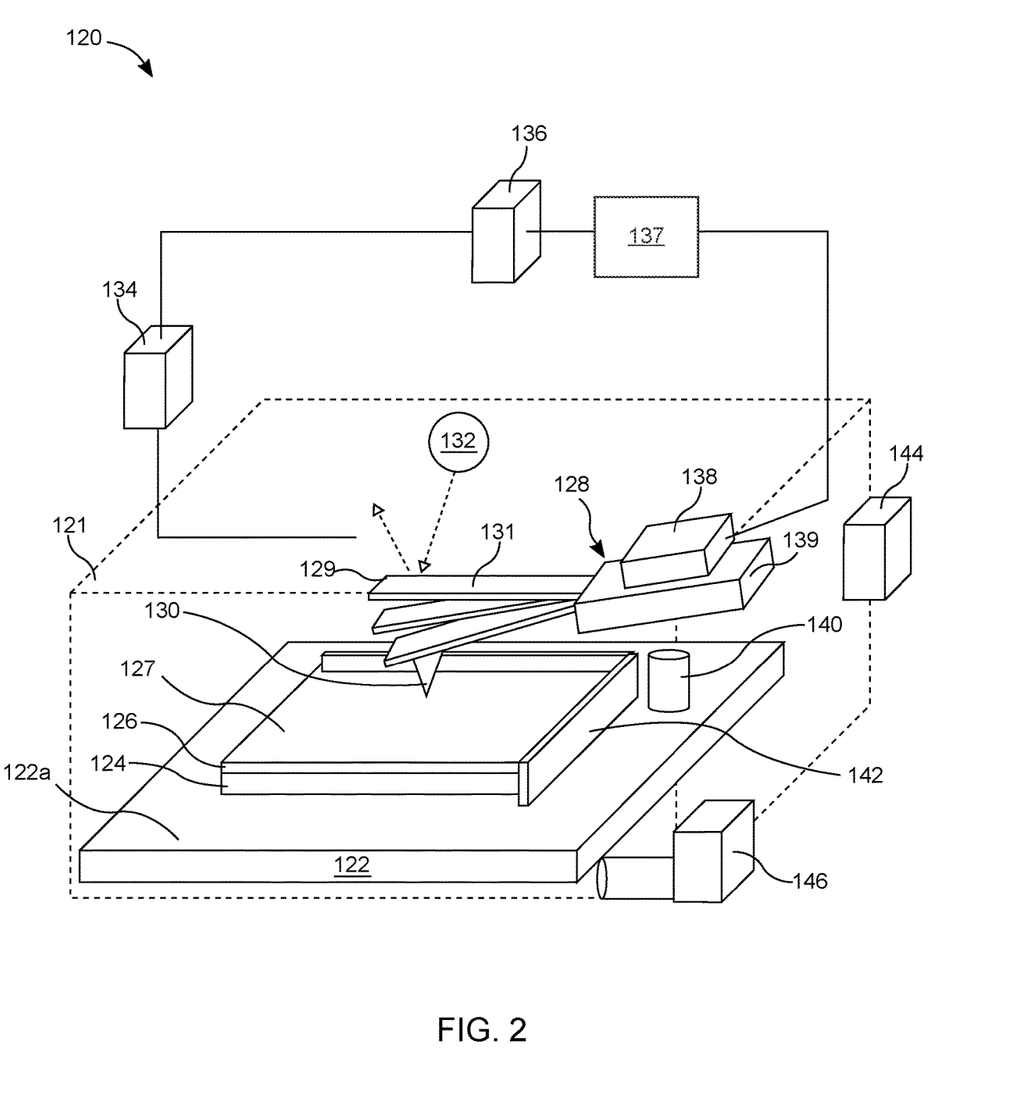
FIG. 2 schematically illustrates an apparatus according to one or more embodiments of the disclosure.
Figure 3:
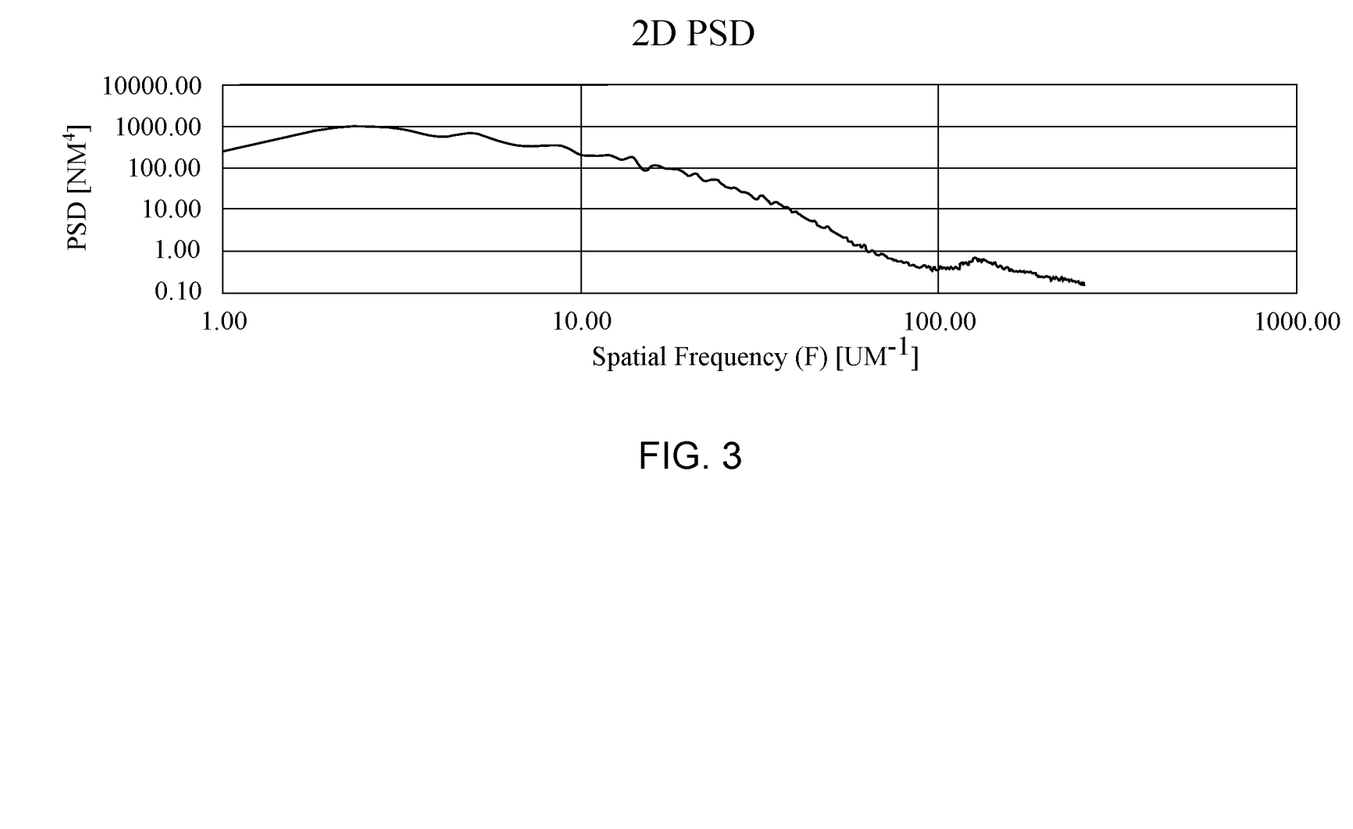
FIG. 3 graphically illustrates transforming topographical data of a sample into a two dimensional PSD value.

In one or more embodiments of the disclosure, a BGL value of a reference sample is calculated from the measurement obtained from the optical scanning apparatus 100 shown in FIG. 1A using a PSD value obtained for the surface topography measurement apparatus 120 as shown in FIG. 2. A surface topography measurement is obtained by the surface topography measurement apparatus, as a topography image with height data, which is converted into power spectral density at different spatial frequencies to obtain a full surface two dimensional PSD curve (2D PSD) as shown in FIG. 3. A BGL value is calculated using the PSD measurement of the reference sample (e.g., an EUV mask blank (the same sample used in the measurement on the optical scanning apparatus 100)) of the surface roughness, and the scattered light from the mask blank propagating through a region confined between the outer numerical aperture and inner numerical aperture values ($NA_{outer}$ and $NA_{inner}$) of the objective lens 113a of the camera 113 shown in FIG. 1A. The BGL value according to one or more embodiments is calculated using the PSD value obtained from a measurement surface of the reference sample, which in some embodiments is the measurement surface of the same reference sample measured on the apparatus of FIG. 1A (e.g., an EUV mask blank comprising a Ru capping layer over a multilayer reflective stack). Therefore, only PSD within the spatial frequencies which correspond to the inner NA and outer NA of the objective lens of the optical scanning apparatus 100 contribute to the BGL value. The spatial frequencies are bounded by an inner spatial frequency ($f_{inner}$) and an outer spatial frequency ($f_{outer}$). In one or more embodiments, the inner spatial frequency ($f_{inner}$) and the outer spatial frequency ($f_{outer}$) is in a range from 3.5 $\mu m^{-1}$ ($f_{inner}$) to 75 $\mu m^{-1}$ ($f_{outer}$), or from 5.1 $\mu m^{-1}$ ($f_{inner}$) to 55 $\mu m^{-1}$ ($f_{outer}$), or from 7.4 $\mu m^{-1}$ ($f_{inner}$) to 20 $\mu m^{-1}$ ($f_{outer}$).

Referring now to FIG. 2, an embodiment of a surface topography measurement apparatus 120 is shown. The surface topography measurement apparatus 120 as shown comprises a platform 122 disposed within an enclosure 121. The platform 122 is configured to support a substrate 124 comprising a measurement surface 127 of the reference sample. The enclosure 121 according to one or more embodiment comprises any suitable frame and material to provide an enclosed space to contain the components of the surface topography measurement apparatus 120 described herein and to provide a controlled atmosphere. According to one or more embodiments, "controlled atmosphere" refers to conditions within the enclosure 121 comprising humidity, temperature and/or pressure maintained within ranges to optimize measurement accuracy and repeatability. The enclosure 121 is not limited to a particular size or material so long as the environment within the enclosure 121 is suitably controlled to provide accurate and repeatable surface topography measurements.

In one or more embodiments, the platform 122 of the surface topography measurement apparatus 120 shown in FIG. 2 further comprises a conductive stage 122a on which a substrate 124 including a reflective layer 126 with a measurement surface 127 is disposed. In one or more embodiments, the substrate 124 comprises quartz and the reflective layer 126 is part of a Bragg reflector. For example, the substrate 124 and the reflective layer 126 may be part of an EUV mask blank, described in further detail with respect to FIG. 6. A sample stage conductive connector 142, which shown as an L-shaped fixture, is positioned on the conductive stage 122a. When the substrate being measured has poor conductivity (e.g., quartz), although the conductive stage 122a and a Bragg reflective layer are conductive, a conductive sample-stage conductive connector 142, made from a conductive material such as aluminum material, removes surface charging from the substrate 124 by grounding to the conductive stage 122a. The platform 122 can include movement control such as mechanical, pneumatic, hydraulic or motor controllers such as a servo motor to enable movement of the sample in x, y and z directions on the platform.

The surface topography measurement apparatus 120 shown in FIG. 2 further includes a cantilever assembly 128 disposed within the enclosure 121. The cantilever assembly comprises a cantilever 129 including a reflective backside 131 and a tip 130 disposed on the side opposite the reflective backside 131. In one or more embodiments, the tip 130 is a sharp tip which scans over the measurement surface 127 of the reference sample. The tip 130 in some embodiments scans in a tapping mode, and attractive force between the measurement surface 127 and the tip 130 cause the cantilever 129 to deflect towards the measurement surface 127, and repulsive force causes the cantilever 129 to deflect away from the measurement surface 127. In some embodiments, the cantilever 129 is made from a ceramic material, for example, SiN, and the reflective backside 131 comprises a reflective coating such as an aluminum coating. In one or more embodiments, the cantilever has a low spring constant. In specific embodiments, the tip 130 has a radius in the range of from 1 nm to 5 nm, for example from 1 nm to 4 nm, and from 1 nm to 3 nm.

In one or more specific embodiments, the cantilever assembly 128 is used in a peak-force tapping mode configured to scan a measurement surface of a substrate such as a surface of an EUV mask blank using a predetermined peak force set point to determine an EUV mask blank BGL value. While various scanning modes (e.g., tapping, scanning, or dragging) are available with for the cantilever assembly 128, it has been determined that after evaluating various scanning modes, and it was determined that the peak-force tapping mode provided the most accurate and stable roughness value. In one or more embodiments, using peak-force tapping, the tip 130 periodically taps the measurement surface 127 and the pico-Newton (pN)-level interaction force between the tip 130 and the measurement surface 127 is measured directly by the deflection of the cantilever. A real feedback loop keeps the peak force down to 10 pN at actuation rates up to 8 kHz. In specific embodiments, a feedback control loop controls the peak force tapping of the tip 130 to control the height of the tip above the measurement surface. For example, in a peak-force tapping mode, a feedback loop may be provided with a controller 136, which is controlled by a peak force setpoint, which may be in a voltage range of 0.01V to 0.20V or from 0.02V to 0.10V. In one or more embodiments, to obtain the most accurate roughness PSD value, the measurement accuracy is controlled by peak force amplitude. The peak force amplitude refers to the zero-to-peak amplitude of the cantilever drive in the Z axis (Z modulation). Increasing the peak force amplitude will reduce the contact time during each tip tapping cycle on the sample and help tracking of a rough and/or sticky sample by avoiding a situation where the tip is unable to pull off from the sample. A reduced peak force amplitude results in less hydrodynamic force disturbance. In embodiments disclosed herein, when the measurement surface 127 is extremely smooth, a smaller value can be used, for example, 50 nm of peak force amplitude, and this value also results in less hydrodynamic force disturbance.

The cantilever assembly 128 further comprises a cantilever holder 139 for holding the end of the cantilever 129 that is opposite the end on which the tip 130 is mounted, and an oscillator 138 mounted on or to the cantilever holder 139 In some embodiments, the oscillator 138 comprises a piezoelectric element that facilitates accurate and precise movements induced by instructions received from the controller 136 in communication with the oscillator 138 to enable precise scanning of the measurement surface 127. In one or more embodiments, oscillation is achieved with a piezoelectric element mounted on or to the cantilever holder 139. In one or more embodiments, instead of a piezoelectric element to induce oscillation of the cantilever 129, an AC magnetic field (with magnetic cantilevers) or periodic heating with a modulated laser beam can be utilized. A piezoelectric element provides the ability to oscillate the tip 130 at a wide range of frequencies. In addition, a piezoelectric element is configured to control movement of cantilever in x (left and right), y (forward and backward) and z (up and down) directions of the cantilever 129 based on signals from the controller 136.

In the embodiment shown, a light source 132 is positioned to reflect light (represented by the dashed arrows extending from the light source 132) from of the reflective backside 131 of the cantilever 129. The light source 132 in some embodiments is a laser. Raised and lowered feature on the measurement surface 127 in the form of bumps, particles and pits influence deflection of the cantilever 129, and a detector 134, for example, a photodetector, monitors the light from the light source 132 reflected from the reflective backside 131 of the cantilever. The detector 134 monitors reflected light (indicated by the dashed arrows in FIG. 2) from the reflective backside 131 of the cantilever 129. In specific embodiments, the detector 112 comprises a position-sensitive photodetector configured to track cantilever deflections by monitoring reflection of the laser light from the reflective backside 131 of the cantilever 129. It will be understood that the cantilever assembly 128 including the cantilever 129 and the tip 130, together with the light source 132 and the detector 134, in some embodiments, comprise an atomic force microscope assembly, which also includes a controller 136 as described further below. Still referring to FIG. 2, the surface topography measurement apparatus 120 according to one or more embodiments further comprises an ionizing source 140 disposed within the enclosure 121 configured to remove surface charge from the measurement surface 127 during topographical scanning. In some embodiments, the ionizing source 140 removes charge generated between the measurement surface and the tip 130 during topographical scanning. In one or more embodiments, the ionizing source comprises a device which reduces electrostatic discharge (ESD) and/or surface charging from a region in proximity to the ionizing source, in particular, at the measurement surface 127 and/or between the measurement surface 127 and the tip 130. Examples of ionizing sources include, but are not limited to, corona ionizers, alpha ionizers, and photon ionizers.

The surface topography measurement apparatus 120 shown in FIG. 2 further comprises an environmental control system 144, which is configured to control temperature and humidity within the enclosure. The oscillator 138 is sensitive to fluctuations in temperature and humidity, particularly when a piezoelectric element is used as the oscillator 138. To maintain accurate measurement sensitivity, temperature and humidity are closely monitored during topographical scanning by the environmental control system 144. Any suitable environmental control system to control temperature and humidity in an enclosure sized to measure surface topography can be utilized.

In some embodiments, the surface topography measurement apparatus 120 further comprises a gas purge system 146 configured to reduce moisture within the enclosure 121. Reducing moisture in the enclosure 121 reduces surface moisture to reduce tip-to-sample adhesion force, thereby reducing noise during measurement by the surface topography measurement apparatus 120. In some embodiments, the gas purge system 146 comprises a nitrogen gas supply, which can be part of the gas purge system in the form of a gas container or a gas line connected to a gas supply (not shown) which reduces surface moisture to reduce tip-to-measurement surface adhesion force and to reduce noise during measurement.

Still referring to FIG. 2, the surface topography measurement apparatus comprises the detector 134 in communication with the controller 136. As discussed herein, the detector 134 is configured to detect light reflected from the reflective backside 131 of the cantilever assembly 128. The controller 136 includes a processor 137 configured to calculate a background level (BGL) value obtained from an optical scan of a reference sample as discussed above with respect to FIG. 1A using a power spectral density (PSD) value obtained from a topographical scan of the reference sample to generate a correlational coefficient between the BGL and the PSD.

In one or more embodiments, the controller 136 including the processor 137 may further comprise a central processing unit (CPU) (not shown), a memory (not shown) and support circuits (not shown). The controller 136 is in communication with the detector 134 and the cantilever assembly. In some embodiments, the controller 136 can be in communication with the environmental control system 144 and the gas purge system 146 to control overall operation of the surface topography measurement apparatus 120. As used herein, "in communication" refers to wired or wireless communication. In some embodiments, the environmental control system 144 and the gas purge system may each be controlled by a separate controller. In addition, the cantilever assembly 128 may be separately controlled by a separate controller. According to one or more embodiments, the controller 136 utilizes a feedback loop to control the height of the tip 130 above the measurements surface 127, maintaining a constant laser position in the detector 134, thereby generating an accurate topographic map of the surface features of the measurement surface 127.

The controller 136 and/or the processor 137 receive scattered light data from the optical scanning apparatus 100 to effect a calculation of the BGL value using the PSD value obtained from the topographical scan performed by the surface topography measurement apparatus 120. The BGL values calculated using the PSD of the reference sample (e.g., an EUV mask blank) and scattered light from the measurement surface of the reference sample propagating through a region confined between the inner and outer NAs of the objective lens 113a of the camera 113 which receives the scattered light can be communicated by a wireless link, wired link, an intranet, or by inputting the data manually or with a memory. The memory (not shown) can be any computer-readable medium, such as random access memory (RAM), read only memory (ROM), floppy disk, hard disk, or any other form of digital storage, local or remote to the apparatus or CPU. The support circuits of some embodiments are coupled to the CPU for supporting the CPU in a conventional manner. In some embodiments, these circuits include cache, power supplies, clock circuits, input/output circuitry and subsystem, and the like. A software routine or a series of program instructions stored in the memory, when executed by the CPU to cause the apparatus to perform a measurement as described herein.

Thus, in some embodiments, the detector 134 is configured to detect light reflected from the reflective backside of the cantilever assembly, the detector including a processor configured to calculate a background level (BGL) value using the power spectral density (PSD) value obtained from a topographical scan of the reference sample to generate a correlational coefficient between the BGL and the PSD.

In one or more embodiments, the PSD value is in a range of from 3.5 $\mu m^{-1}$ to 75 $\mu m^{-1}$ and the processor is further configured to transform a PSD value obtained from an extreme ultraviolet (EUV) mask blank to determine an EUV mask blank BGL value. In some embodiments, the PSD value is in a range of from 5.1 $\mu m^{-1}$ to 55 $\mu m^{-1}$ or the PSD value is in a range of from 7.4 $\mu m^{-1}$ to 20 $\mu m^{-1}$. In one or more embodiments, the tip 130 is configured to scan a surface of an EUV mask blank and the surface topography measurement apparatus to measure a roughness of the surface of an EUV mask blank.

Figure 7:
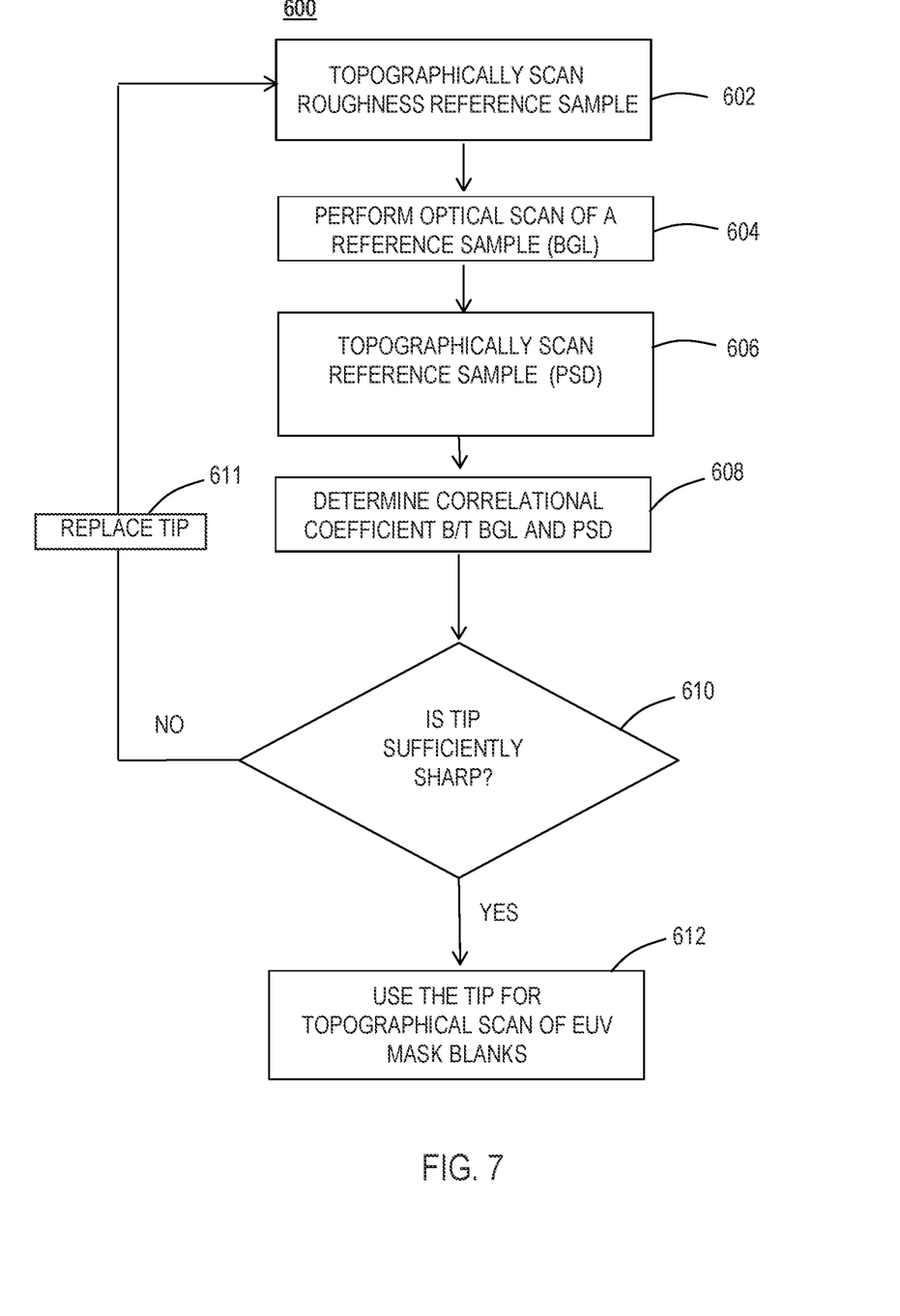
FIG. 7 is a flowchart illustrating a method according to one or more embodiments.

One or more embodiments of the disclosure are directed to a method for detecting—BGL on a substrate surface, for example, using an apparatus of one or more embodiments disclosed herein. For example, FIG. 7 illustrates a process flow diagram of a method 600 according to one or more embodiments. In one or more embodiments a roughness reference sample (e.g., CrN) is topographically scanned in an apparatus such as the type shown in FIG. with a tip 130. In one or more embodiments, at operation 604, a reference sample (e.g., an EUV mask blank including a ruthenium capping layer on a multilayer stack) is optically scanned to obtain an optical roughness measurement of the reference sample. In specific embodiments, an optical scan of a measurement surface of a reference sample is performed at 604, which is used to calculate a background level (BGL) value due to scattering from surface defects on the measurement surface of the reference sample. In some embodiments, the optical roughness measurement data may already be saved as a reference data point, obviating the need to scan the reference sample over the course of multiple operations.

At operation 606, a topographical scan of the reference sample is performed using a tip mounted to a cantilever and to obtain a power spectral density (PSD) value of the measurement surface of the same reference sample from the optical scan. At operation 608, the correlational coefficient between BGL and PSD is determined using the optical roughness measurement data obtained from the optical scan (e.g., using an apparatus as shown in FIG. 1A) and the topographical scan data (e.g., obtained from the apparatus in FIG. 2). Thus, a correlational coefficient between the BGL and the PSD values is determined.

At 610, the tip 130 of the surface topography measurement apparatus 120 is checked for sharpness. The tip 130 can be checked periodically over a certain number of n measurements, where n is an integer from 1 to 500. In some embodiments, the tip is checked for sharpness after each measurement by the apparatus 120 of a sample such as an EUV mask blank. The sharpness of the tip 130 is checked using a roughness reference sample, and the tip is checked for sharpness before a reference sample is topographically scanned to obtain a starting or baseline measurement of tip sharpness. Thus in some embodiments a $R_{q\_pre}$ value is obtained by performing a topographical scan of the roughness reference sample (e.g., CrN). Then after a topographical scan of each sample (or a certain number (n) of samples), a topographical scan is performed is subsequently performed on the roughness reference sample (e.g., CrN) to obtain a $R_{q\_post}$ value. The values of $R_{q\_pre}$ and $R_{q\_post}$ are then compared. If $R_{q\_pre}$ is greater than $R_{q\_post}$, that means the tip is becoming blunt or dulled, and therefore the tip will be changed at 611, and a new $R_{q\_pre}$ value is obtained by scanning the roughness reference sample (e.g., CrN) with the new tip.

By using the roughness reference sample as described herein, the sharpness of the tip can be monitored. In one or more embodiments, the roughness reference sample comprises a material that has an RMS roughness that is greater than the reference sample RMS roughness. In some embodiments, the roughness reference sample comprises a material that has a Knoop hardness that is greater than the reference sample Knoop hardness. In some embodiments, the roughness reference sample comprises a material that has a density that is greater than the reference sample density. In some embodiments, the roughness reference sample comprises a material that has an elastic modulus that is greater than the reference sample elastic modulus.

The tip 130 of the surface topography measurement apparatus 120 can comprise a material such as silicon nitride (SiN). Over time and use through repeated measurements of sample roughness, for example of EUV mask blanks, the sharpness of the tip 130 will be reduced. PSD measurement sensitivity is highly dependent on the sharpness of tip. A sharper tip provides higher measurement sensitivity, and higher accuracy measured PSD value will be obtained. Therefore, the tip 130 of the surface topography measurement apparatus 120 is periodically checked on a schedule that can be determined experimentally to provide accurate measurements. In one or more embodiments, as described herein, the roughness reference sample has a higher RMS roughness than the RMS roughness of the reference sample. For example, in the measurement of EUV mask blanks and when the reference sample is an EUV mask blank, a roughness reference sample comprises CrN. CrN has a higher RMS roughness than an EUV mask blank, and by measuring RMS of CrN reference, the scanning tip conditions sharpness can be monitored. Thus, the roughness reference sample is wear-resistant and a stable roughness reference sample.

In one or more embodiments, if it is determined at 610 that the tip is not sharp enough for further use, at operation 611, a new tip 130 is provided on the surface topography measurement apparatus 120, and the method 600 returns to operation 602 perform a new topographical scan of the roughness reference sample. Over time and usage of a validated tip, the validated tip will dull. Upon determination that the tip is no longer sharp, the tip will be replaced at operation 611, and the method 600 will pick up again operation 606 of validating a BGL value versus PSD for each new tip.

In one or more embodiments of the method, the optical scan of the measurement surface of a reference sample comprises scanning the measurement surface of the reference sample with an EUV light source. In one or more embodiments, the PSD value is defined by an inner numerical aperture and an outer numerical aperture of an objective lens used in the optical scan. According to some embodiments, the measurement surface of the roughness reference sample comprises a material having a modulus in a range of from about 100 GPa to 300 GPa, a hardness in a range of from 2000 kg/mm$^2$ to 2500 kg/mm$^2$, and a surface roughness RMS in the range of from 0.4 nm to 1.1 nm. In one or more embodiments, the apparatus described herein are used to perform the measurements, and the topographical scan is performed in a peak-force tapping mode. Some embodiments of the method include using an ionizing source to remove surface charging from the measurement surface of the reference sample during topographical scanning and flowing a nitrogen gas to reduce moisture during topographical scanning.

In a specific embodiment, a method of measuring a roughness of a surface of an EUV mask blank, the method comprises providing an apparatus including a platform within an enclosure configured to support a substrate including a measurement surface; a cantilever assembly disposed within the enclosure, the cantilever assembly comprising a reflective backside and a tip configured to topographically scan defects on the measurement surface; a light source positioned to reflect light from the reflective backside of the cantilever assembly; an ionizing source disposed within the enclosure and configured to remove surface charging from the measurement surface during topographical scanning; a gas purge system configured to reduce moisture in the enclosure; an environmental control system configured to control temperature and humidity within the enclosure; and a detector configured to detect light reflected from the reflective backside of the cantilever assembly, the detector including a processor configured to compare a background level (BGL) value obtained from an optical scan. The method includes optically scanning a reference sample, calculating the BGL value using the optical scan of the of the reference sample and a power spectral density (PSD) value obtained from a topographical scan of the reference sample to generate a correlational coefficient between the BGL and PSD values.

Figure 4:
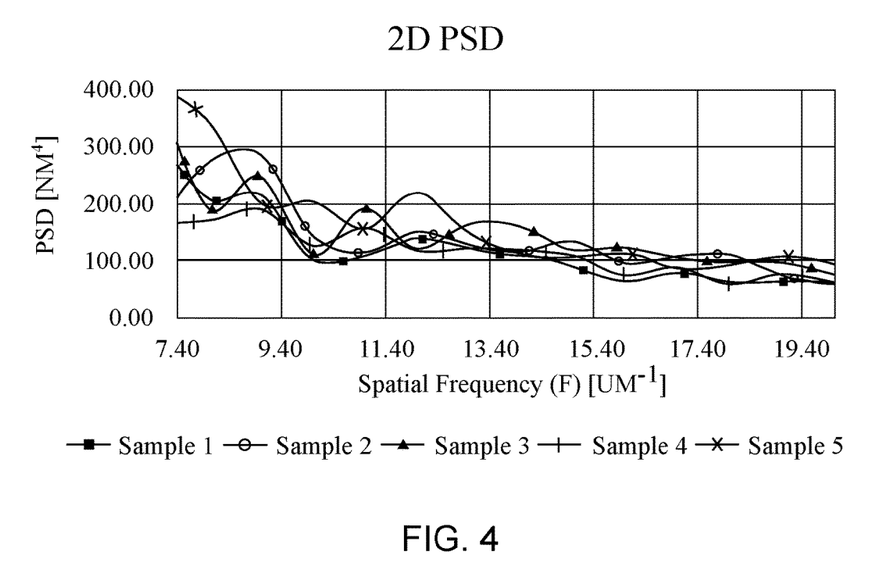
FIG. 4 graphically illustrates a conversion of topographical data into PSD over a defined spatial frequency range.

Referring now to FIG. 3, a graph is shown, demonstrating conversion of a data points obtained from a topography image with measurement surface height information obtained from an optical scanning apparatus 100 to a 2D PSD curve at different spatial frequencies to obtain a full surface 2D PSD curve. FIG. 4 is a graph illustrating a truncation of the data in FIG. 3, which pertains to a range that is relational to the NA$_{inner}$ and NA$_{outer}$ of the objective lens 113a of the detector 112, which is used to determine an α value in Equation (1) below by experimental fitting. In the specific embodiment shown, the NA$_{inner}$ and NA$_{outer}$ are respectively 7.4 μm$^{-1}$ and 20 μm$^{-1}$. The BGL value is calculated using the PSD of the reference sample measurement surface roughness, which in some embodiments is an EUV mask blank, and the scattered light from the measurement surface propagating through a region confined between the inner and outer NAs of the objective lens 113a of the camera 113 which receives the scattered light. Therefore, only PSD within the spatial frequencies which correspond to the inner and outer NA contributes to the calculated BGL value (as well as the BGL$_{measured}$).

Figure 5A:
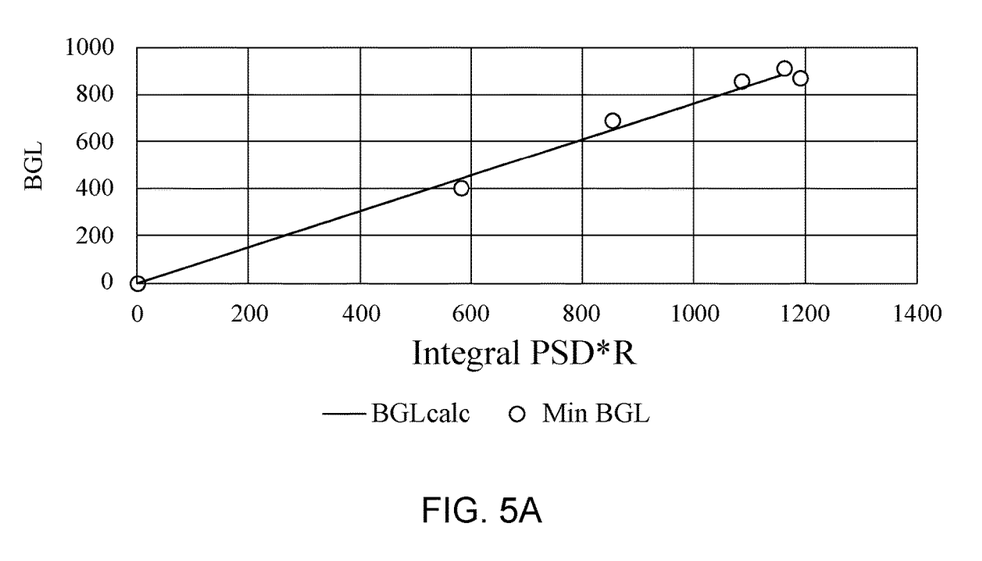
FIG. 5A graphically illustrates the relationship between a measured BGL value and the calculated integral of PSD×a reflectance R.
Figure 5B:
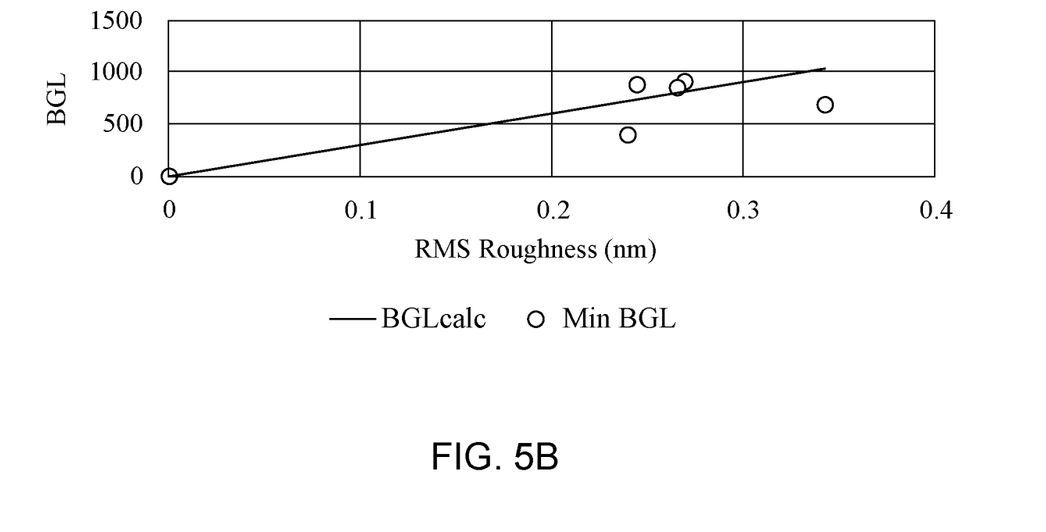
FIG. 5B graphically illustrates the relationship between BGL values and RMS surface roughness.
Figure 5C:
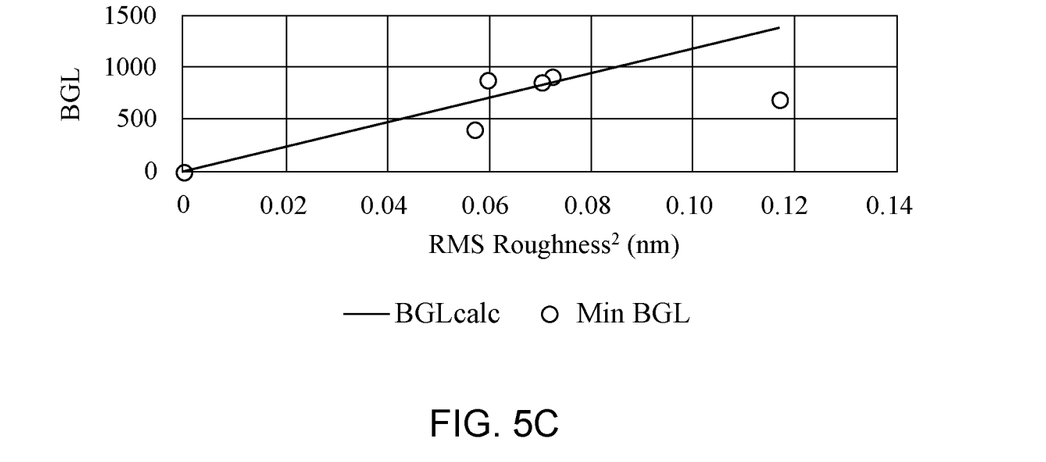
FIG. 5C demonstrates the relationship between BGL values and RMS surface roughness$^2$.
Figure 5D:
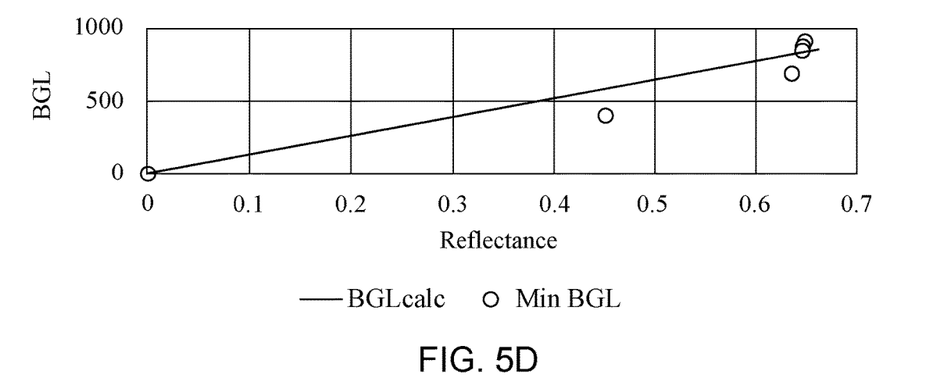
FIG. 5D graphically illustrates the relationship between a BGL value and reflectance R.
Figure 5E:
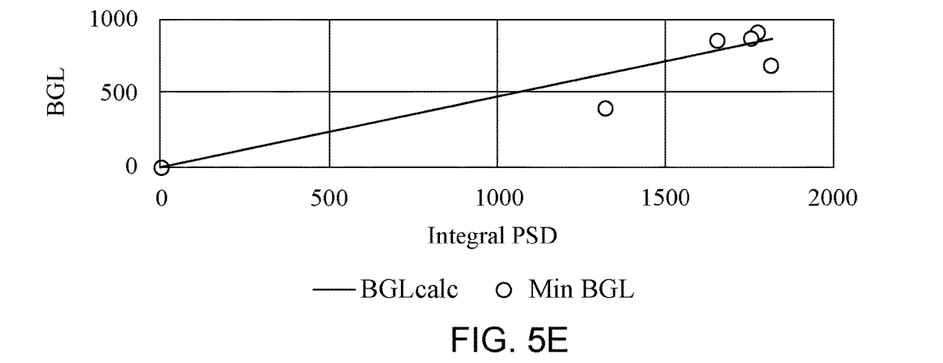
FIG. 5E graphically illustrates the relationship between a BGL value and Integral PSD.

FIG. 5A illustrates the relationship between the BGL$_{calc}$ vs. (Integral PSD×R), where R is reflectance, assuming that the R was uniform at full-field of the measurement surface. When compared with the relationship between BGL$_{calc}$ vs RMS roughness (FIG. 5B), BGL$_{calc}$ vs RMS roughness$^2$ (FIG. 5C), BGL$_{calc}$ vs R (FIG. 5D), and BGL$_{calc}$ vs Integral PSD (FIG. 5E), the BGL$_{calc}$ of FIG. 5A has a linear and greater correlation to Integral PSD×R than that of either RMS roughness or RMS roughness$^2$.

A PSD value is derived from topographical data obtained using the apparatus 120, which generates the graph of FIG. 3, which is then converted and truncated to a range defined by a NA$_{inner}$ and NA$_{outer}$ as shown in FIG. 4. As this conversion and truncation now makes the PSD value relational to the BGL value over the same range as is defined by the NA$_{inner}$ and NA$_{outer}$ of the objective lens 113a of the optical scanning apparatus 100 (for example 7.4 μm$^{-1}$ to 19.4 μm$^{-1}$), the BGL value can be calculated from the PSD value as is demonstrated by the linear relationship between the data sets is then expressed via the following formula (1):

$$BGL = \alpha \cdot R \cdot \int_{f_{inner}}^{f_{outer}} f \times PSD(f) df, \quad (1)$$

where α is constant. The terms $f_{outer}$ and $f_{inner}$ are defined by the outer and inner NA values using the equation (2), where R is reflectance, assuming that the R was uniform at full-field of the measurement surface, and a is coefficient which can be obtained experimentally:

$$f = NA/\lambda, \quad (2)$$

where the $f_{outer}$ and $f_{inner}$ are calculated using the NA$_{outer}$ and NA$_{inner}$ of the objective lens 113a and the λ is defined by the wavelength of the light source 106 used in the optical scanning apparatus. R is defined by a reflectance value and assumes that the reflectance R was uniform over the full field of the measurements surface of the reference sample. Thus, solving for a coefficient α relates to the tip of the topographical scanning apparatus of one or more embodiments above. The coefficient α can then be used in conjunction with the topographical scanning apparatus of one or more embodiments noted above on any number of non-reference surfaces to achieve rapid analysis of non-reference surfaces by reverse calculating a BGL value free of any specular scattering interference. The example principle noted above is non-limiting in the sense that the $NA_{outer}$ and $NA_{inner}$ can be adjusted according to the optical hardware available and as needed.

Figure 6:
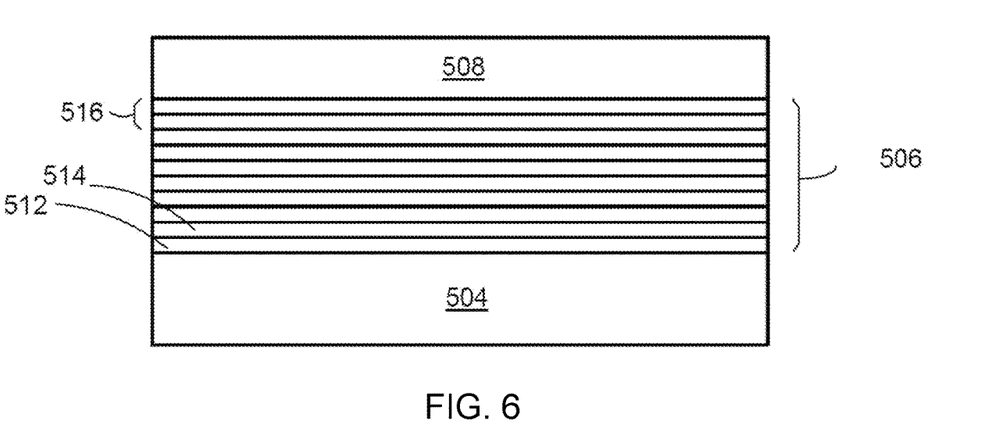
FIG. 6 illustrates an embodiment of an extreme ultraviolet reflective element such as an EUV mask blank.

Referring now to FIG. 6, an embodiment of an extreme ultraviolet mask blank 502 which is measured according to one or more embodiment of the methods and apparatus described herein includes a substrate 504, a multilayer stack 506 of reflective layers, and a capping layer 508. The EUV mask blank 502 includes the substrate 504, the multilayer stack 506 of reflective layers comprising alternating layers of silicon and molybdenum, and an optional capping layer 508.

The EUV mask blank 502 is an optically flat structure used for forming a reflective mask having the mask pattern. In one or more embodiments, the reflective surface of the EUV mask blank 502 forms a flat focal plane for reflecting the incident light, such as the extreme ultraviolet light from the light source 106 of FIG. 1A.

The substrate 504 is an element for providing structural support to the extreme ultraviolet mask blank 502. In one or more embodiments, the substrate 504 is made from a material having a low coefficient of thermal expansion (CTE) to provide stability during temperature changes. In one or more embodiments, the substrate 504 has properties such as stability against mechanical cycling, thermal cycling, crystal formation, or a combination thereof. The substrate 504 according to one or more embodiments is formed from a material such as silicon, glass, oxides, ceramics, glass ceramics, or a combination thereof.

The multilayer stack 506 is a structure that is reflective to the extreme ultraviolet light. The multilayer stack 506 includes alternating reflective layers of a first reflective layer 512 and a second reflective layer 514. The first reflective layer 512 and the second reflective layer 514 form a reflective pair 516 of FIG. 6. In a non-limiting embodiment, the multilayer stack 506 includes a range of 20-60 of the reflective pairs 516 for a total of up to 120 reflective layers.

The first reflective layer 512 and the second reflective layer 514 according to one or more embodiments are formed from a variety of materials. In an embodiment, the first reflective layer 512 and the second reflective layer 514 are formed from silicon and molybdenum, respectively. The first reflective layer 512 and the second reflective layer 514 of some embodiments have a variety of structures. In an embodiment, both the first reflective layer 512 and the second reflective layer 514 are formed with a single layer, multiple layers, a divided layer structure, non-uniform structures, or a combination thereof. Because most materials absorb light at extreme ultraviolet wavelengths, the optical elements used are reflective instead of the transmissive, as used in other lithography systems. The multilayer stack 506 forms a reflective structure by having alternating thin layers of materials with different optical properties to create a Bragg reflector or mirror.

In an embodiment, each of the alternating layers has dissimilar optical constants for extreme ultraviolet light. The alternating layers provide a resonant reflectivity when the period of the thickness of the alternating layers is one half the wavelength of extreme ultraviolet light. In an embodiment, for the extreme ultraviolet light is at a wavelength of 13.5 nm, the alternating layers are about 6.5 nm thick. It is understood that the sizes and dimensions provided are within normal engineering tolerances for typical elements.

The multilayer stack 506 according to one or more embodiments is formed in a variety of ways. In an embodiment, the first reflective layer 512 and the second reflective layer 514 are formed with magnetron sputtering, ion sputtering systems, pulsed laser deposition, cathode arc deposition, or a combination thereof.

In an illustrative embodiment, the multilayer stack 506 is formed using a physical vapor deposition technique, such as magnetron sputtering. In an embodiment, the first reflective layer 512 and the second reflective layer 514 of the multilayer stack 506 have the characteristics of being formed by the magnetron sputtering technique including precise thickness, low roughness, and clean interfaces between the layers. In an embodiment, the first reflective layer 512 and the second reflective layer 514 of the multilayer stack 506 have the characteristics of being formed by the physical vapor deposition including precise thickness, low roughness, and clean interfaces between the layers.

The physical dimensions of the layers of the multilayer stack 506 formed using the physical vapor deposition technique are precisely controlled to increase reflectivity. In an embodiment, the first reflective layer 512, such as a layer of silicon, has a thickness of 4.1 nm. The second reflective layer 514, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm of some embodiments reduced.

In one or more embodiments, the capping layer 508 is a protective layer allowing the transmission of the extreme ultraviolet light. In an embodiment, the capping layer 508 is formed directly on the multilayer stack 506. In one or more embodiments, the capping layer 508 protects the multilayer stack 506 from contaminants and mechanical damage. In one embodiment, the multilayer stack 506 is sensitive to contamination by oxygen, carbon, hydrocarbons, or a combination thereof. The capping layer 508 according to an embodiment interacts with the contaminants to neutralize them.

In one or more embodiments, the processes described herein may generally be stored in the memory as a software routine that, when executed by a controller or a processor, causes a topographical scanning apparatus to perform one or more processes of the present disclosure. The software routine may also be stored and/or executed by a second controller or processor (not shown) that is remotely located from the hardware being controlled by the controller or processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general purpose computer into a specific purpose computer (controller) that controls the apparatus operation such that the processes are performed.

The process can be stored on non-transitory computer readable medium including instructions, that, when executed by a controller or a processor of a topography scanning apparatus of one or more embodiments above, causes the apparatus to compare the BGL value obtained from an optical scan of a reference sample with a PSD value obtained from a topographical scan of the reference sample to generate a correlational coefficient between the BGL and PSD values, and topographically scan a surface of an EUV mask blank to obtain a roughness value of the surface of the EUV mask blank.

According to one or more embodiments, the apparatus and method described herein provide an accurate PSD value with extremely low noise level by utilizing the apparatus including gas purge to reduce tip-to-sample surface adhesion force caused vibration and utilizing ionizing bar to remove surface charging during measurement. In addition, embodiments provide a precise PSD value by monitoring tip condition (sharpness) using a roughness reference sample, e.g., a CrN sample for an EUV mask blank. In some embodiments, determining the EUV background level is used for actinic blank defect detection, where a defect is captured as a spot signal brighter than its BGL value. The methods and apparatus according to one or more embodiments based on PSD measurement transforms obscure Power Spectral Density theories into a simple experimental equation which is capable used in EUV mask substrate/blank surface optical scattering analysis. Embodiments provide an inexpensive and fast solution for EUV mask blank quality evaluation. The actinic blank inspection resource is extremely limited in the world, not only due to the cost but also due to months of queue time for inspecting one sample.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein provided a description with reference to particular embodiments, it is to be understood that these embodiments are merely illustrative of the principles and applications of the disclosure. It will be apparent to those skilled in the art that various modifications and variations can be made to the present disclosure without departing from the spirit and scope thereof. Thus, it is intended that the present disclosure include modifications and variations that are within the scope of the appended claims and their equivalents.

What is claimed is:

1. A method for detecting a background level (BGL) value on EUV mask blanks, the method comprising:
    performing an optical scan of a measurement surface of an EUV mask blank reference sample using a camera with an objective lens to receive scattered light from a surface roughness on the measurement surface of the EUV mask blank reference sample;
    performing a topographical scan of the measurement surface of the EUV mask blank reference sample with a tip mounted to a cantilever assembly and obtaining a power spectral density (PSD) value of the measurement surface of the EUV mask blank reference sample from the topographical scan;
    utilizing the BGL value of the measurement surface of the EUV mask blank reference sample and the PSD value of the measurement surface of the EUV mask blank reference sample to calculate a correlational coefficient between the BGL value and the PSD value; and
    utilizing the correlational coefficient between the BGL value and the PSD value to determine a BGL value of an EUV mask blank by a topographical scan of the EUV mask blank using the tip mounted to the cantilever.

2. The method of claim 1, wherein the optical scan of the measurement surface of the EUV mask blank reference sample comprises scanning the measurement surface of the EUV mask blank reference sample with an EUV light source.

3. The method of claim 2, wherein the cantilever assembly includes a cantilever having a reflective backside and the method further comprises reflecting light from a light source from the reflective backside.

4. The method of claim 3, further comprising detecting light reflected from the reflective backside of the cantilever.

5. The method of claim 4, wherein detecting the light reflected from the backside of the cantilever comprises using a detector in communication with a controller including a processor configured to calculate the background level (BGL) value obtained using scattered light obtained from the optical scan of the EUV mask blank reference sample and the power spectral density (PSD) value obtained from the topographical scan of the EUV mask blank reference sample which generates the correlational coefficient between the BGL value and the PSD value.

6. The method of claim 1, wherein the PSD value is defined by an inner numerical aperture and an outer numerical aperture of the objective lens used in the optical scan.

7. The method of claim 1, further comprising periodically checking sharpness of the tip by topographically scanning a measurement surface of a roughness reference sample comprising a material having a modulus in a range of from about 100 GPa to 300 GPa, a hardness in a range of from 2000 kg/mm$^2$ to 2500 kg/mm$^2$, and a surface roughness RMS in the range of from 0.4 nm to 1.1 nm.

8. The method of claim 7, wherein the measurement surface of the roughness reference sample comprises a material selected the group consisting of chromium nitride (CrN), titanium nitride (TiN), and tantalum nitride (TaN).

9. The method of claim 1, wherein the tip has a radius in range of from 1 nm to 5 nm.

10. The method of claim 1, wherein performing the topographical scan is performed in a peak-force tapping mode.

11. The method of claim 10, wherein the cantilever assembly comprises a piezoelectric element that facilitates movements of the cantilever.

12. The method of claim 1, further comprising using an ionizing source to remove surface charging from the measurement surface of the reference sample during topographical scanning and flowing a nitrogen gas to reduce moisture during topographical scanning.

13. The method of claim 1, further comprising placing the EUV mask blank in an enclosure and controlling temperature and humidity in the enclosure during the topographical scan of the EUV mask blank.

14. The method of claim 1, wherein the PSD value is in a range of from 3.5 µm$^{-1}$ to 75 µm$^{-1}$ and the method further comprises transforming the PSD value obtained from the EUV mask blank reference sample to calculate an EUV mask blank reference sample BGL value.

15. The method of claim 14, wherein the PSD value is in a range of from 5.1 $\mu m^{-1}$ to 55 $\mu m^{-1}$.

16. The method of claim 14, wherein the PSD value is in a range of from 7.4 $\mu m^{-1}$ to 20 $\mu m^{-1}$.

17. The method of claim 1, further comprising using a gas purge system to reduce moisture in the enclosure, the gas purge system comprising a nitrogen gas supply which reduces surface moisture to reduce tip-to-measurement surface adhesion force and reduces noise during measurement.

* * * * *

UNITED STATES PATENT AND TRADEMARK OFFICE
CERTIFICATE OF CORRECTION

PATENT NO. : 11,604,151 B2  
APPLICATION NO. : 17/747639  
DATED : March 14, 2023  
INVENTOR(S) : Weimin Li et al.

Page 1 of 1

It is certified that error appears in the above-identified patent and that said Letters Patent is hereby corrected as shown below:

In the Specification

- Column 12, Line 58, replace "$BGL = a \cdot R \cdot \int_{f_{inner}}^{f_{outer}} f \times PSD(f)df,$" with "$BGL = \alpha \cdot R \cdot \int_{f_{inner}}^{f_{outer}} f \times PSD(f)df,$"

- Column 12, Line 62, replace "a" after "and" and before "is coefficient" with "$\alpha$"

Signed and Sealed this  
Ninth Day of May, 2023

Katherine Kelly Vidal  
*Director of the United States Patent and Trademark Office*